United States Patent
Babic

(10) Patent No.: US 7,582,181 B2
(45) Date of Patent: *Sep. 1, 2009

(54) METHOD AND SYSTEM FOR CONTROLLING A VELOCITY FIELD OF A SUPERCRITICAL FLUID IN A PROCESSING SYSTEM

(75) Inventor: Darko Babic, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 833 days.

This patent is subject to a terminal disclaimer.

(21) Appl. No.: 10/955,326

(22) Filed: Sep. 30, 2004

(65) Prior Publication Data

US 2006/0065636 A1    Mar. 30, 2006

(51) Int. Cl.
*C23C 16/00* (2006.01)
(52) U.S. Cl. .................. 156/345.18; 118/715; 134/1.2
(58) Field of Classification Search ............ 156/345.18; 118/715; 134/1.2
See application file for complete search history.

(56) References Cited

U.S. PATENT DOCUMENTS

| 5,494,526 | A  | * | 2/1996 | Paranjpe ..................... 134/1 |
| 6,239,038 | B1 | * | 5/2001 | Wen ........................ 438/745 |
| 2006/0065189 | A1 | * | 3/2006 | Babic et al. ................ 118/50 |
| 2006/0065636 | A1 | * | 3/2006 | Babic ...................... 216/93 |
| 2006/0070640 | A1 | * | 4/2006 | Babic et al. ............... 134/42 |
| 2006/0130966 | A1 | * | 6/2006 | Babic et al. ............ 156/345.1 |

\* cited by examiner

*Primary Examiner*—Sylvia R. MacArthur
(74) *Attorney, Agent, or Firm*—Wood, Herron & Evans, L.L.P.

(57) ABSTRACT

A method and system for controlling a velocity field in a processing system is described. In an exemplary embodiment described, the system includes a multi-outlet exhaust manifold having three or more outlets coupled to the processing system adjacent a surface of a substrate to be process. The three or more outlets are located adjacent the substrate in order to provide for a uniform flow of fluid above the surface of the substrate. Additionally, the flow of fluid through the three or more outlets is cyclically and sequentially alternated.

9 Claims, 10 Drawing Sheets

METHOD AND SYSTEM FOR CONTROLLING A VELOCITY FIELD OF A SUPERCRITICAL FLUID IN A PROCESSING SYSTEM

BACKGROUND OF THE INVENTION

This application is related to U.S. patent application filed as Ser. No. 10/955,325 filed on even date herewith, hereby expressly incorporated by reference herein.

1. Field of the Invention

The present invention relates to a method and apparatus for flowing a fluid over a substrate in a processing system and, more particularly, to a method and apparatus for controlling the velocity field of the fluid flow over the substrate in a processing system.

2. Description of Related Art

During the fabrication of semiconductor devices for integrated circuits (ICs), a critical processing requirement for processing semiconductor devices is cleanliness. The processing of semiconductor devices includes vacuum processing, such as etch and deposition processes whereby material is removed from or added to a substrate surface, as well as atmospheric processing, such as wet cleaning whereby contaminants or residue accumulated during processing are removed. For example, the removal of residue, such as photoresist, hardened photoresist, post-etch residue, and post-ash residue subsequent to the etching of features, such as trenches or vias, can utilize dry plasma ashing with an oxygen plasma followed by wet cleaning.

Until recently, dry plasma ashing and wet cleaning were found to be sufficient for removing residue and contaminants accumulated during semiconductor processing. However, recent advancements for ICs include a reduction in the critical dimension for etched features below a feature dimension acceptable for wet cleaning, such as a feature dimension below 45 to 65 nanometers, as well as the introduction of new materials, such as low dielectric constant (low-k) materials, which are susceptible to damage during plasma ashing.

Therefore, at present, interest has developed for the replacement of dry plasma ashing and wet cleaning. One interest includes the development of dry cleaning systems utilizing a supercritical fluid as a carrier for a solvent, or other residue removing composition. Post-etch and post-ash cleaning are examples of such systems. Other interests include other processes and applications that can benefit from the properties of supercritical fluids, particularly of substrates having features with a dimension of 65 nm, or 45 nm, or smaller. Such processes and applications may include restoring low dielectric films after etching, sealing porous films, drying of applied films, depositing materials, as well as other processes and applications. At present, the inventors have recognized that conventional processing systems offer insufficient control of the flow, or velocity field, of the supercritical fluid over the substrate to be treated and, furthermore, such systems suffer from particulate contamination.

SUMMARY OF THE INVENTION

One aspect of the invention is to reduce or eliminate any or all of the above-described problems.

Another object of the invention is to provide a method and system for controlling the flow of a fluid over a substrate in a processing system.

Another object of the invention is to provide a method and system for providing an unsteady flow of a fluid over a substrate with a substantially uniform ensemble average flow of fluid over the substrate.

According to one aspect, a processing system for treating a substrate is described comprising a processing chamber configured to treat said substrate with a fluid introduced therein having substantially supercritical fluid properties, a fluid supply system coupled to said processing chamber and configured to introduce a fluid to said processing chamber, a fluid flow system coupled to said processing chamber and configured to flow said fluid through said processing chamber over said substrate, one or more inlets coupled to said fluid flow system and configured to introduce said fluid to said processing chamber, and an outlet manifold coupled to said fluid flow system, the outlet manifold having three or more outlets coupled to said fluid flow system and positioned adjacent a surface of said substrate, wherein said three or more outlets are configured to remove said fluid from said processing chamber, and a valve manifold coupled to said three or more outlets and configured to cyclically and sequentially alter the flow of said fluid through said three or more outlets.

According to another aspect, a method of processing in a supercritical fluid processing system is described comprising introducing a fluid to said processing system through one or more inlets coupled to said processing system, treating said substrate in said processing system with said fluid by bringing the fluid to a state having substantially supercritical fluid properties and exposing the substrate to the fluid in that state, and cyclically and sequentially removing said fluid from said processing system through three or more outlets coupled to said processing system and adjacent a surface of said substrate.

DETAILED DESCRIPTION OF EXEMPLARY EMBODIMENTS

In the following description, to facilitate a thorough understanding of the invention and for purposes of explanation and not limitation, specific details are set forth, such as a particular geometry of the processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
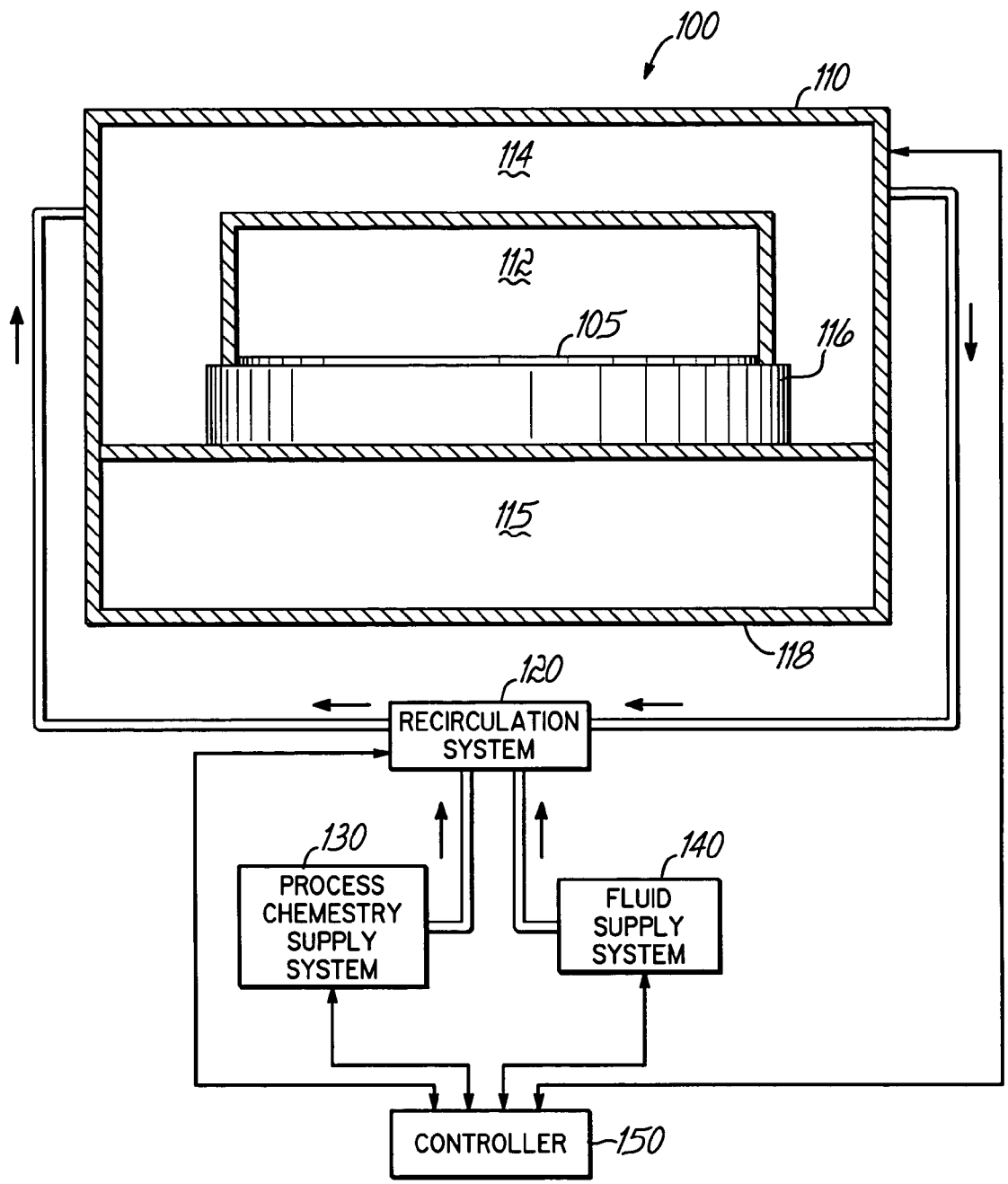
FIG. 1 presents a simplified schematic representation of a processing system.

Referring now to the drawings, wherein like reference numerals designate identical or corresponding parts throughout the several views, FIG. 1 illustrates a processing system 100 according to an embodiment of the invention. In the illustrated embodiment, processing system 100 comprises processing elements that include a processing chamber 110, a fluid flow system 120, a process chemistry supply system 130, a fluid supply system 140, and a controller 150, all of which are configured to process substrate 105. The controller 150 can be coupled to the processing chamber 110, the fluid flow system 120, the process chemistry supply system 130, and the fluid supply system 140. Alternately or in addition, controller 150 can be coupled to a one or more additional controllers/computers (not shown), and controller 150 can obtain setup and/or configuration information from an additional controller/computer.

In FIG. 1, singular processing elements (110, 120, 130, 140, and 150) are shown, but this is not required for the invention. The processing system 100 can comprise any number of processing elements having any number of controllers associated with them in addition to independent processing elements.

The controller 150 can be used to configure any number of processing elements (110, 120, 130, and 140), and the controller 150 can collect, provide, process, store, and display data from processing elements. The controller 150 can comprise a number of applications for controlling one or more of the processing elements. For example, controller 150 can include a graphic user interface (GUI) component (not shown) that can provide easy to use interfaces that enable a user to monitor and/or control one or more processing elements Referring still to FIG. 1, the fluid flow system 120 is configured to flow fluid and chemistry from the supplies 130 and 140 through the chamber 110. The fluid flow system 120 is illustrated as a recirculation system through which the fluid and chemistry recirculate from and back to the chamber 110. This recirculation is most likely to be the preferred configuration for many applications, but this is not necessary to the invention. Fluids, particularly inexpensive fluids, can be passed through the chamber once then discarded, which might be more efficient than reconditioning them for reentry into the chamber. Accordingly, while the fluid flow system is described as a recirculating system in the exemplary embodiments, a non-recirculating system may, in some cases, be substituted. This fluid flow system or recirculation system 120 can include one or more valves for regulating the flow of a processing solution through the recirculation system 120 and through the processing chamber 110. The recirculation system 120 can comprise any number of back-flow valves, filters, pumps, and/or heaters (not shown) for maintaining a specified temperature, pressure or both for the processing solution and flowing the process solution through the recirculation system 120 and through the processing chamber 110.

Referring still to FIG. 1, the processing system 100 can comprise fluid supply system 140. For example, the fluid supply system 140 can include a high pressure fluid supply system (relative to atmospheric pressure). Alternatively or in addition, the fluid supply system 140 can include a low pressure fluid supply system (relative to atmospheric pressure). The fluid supply system 140 can include a supercritical fluid supply system. A supercritical fluid as referred to herein is a fluid that is in a supercritical state, which is that state that exists when the fluid is maintained at or above the critical pressure and at or above a critical temperature on its phase diagram, which pressure is typically also temperature dependent. In such a supercritical state, the fluid possesses certain properties, one of which is the substantial absence of a surface tension. Accordingly, a supercritical fluid supply system, as referred to herein, is one that delivers to a processing chamber a fluid that assumes a supercritical state at the pressure and temperature at which the processing chamber is being controlled. Furthermore, it is only necessary that at least at or near the critical point so that the fluid is in a substantially supercritical state at which its properties are sufficient, and exist long enough, to realize their advantages in the process being performed. The fluid supply system 140 can include a carbon dioxide fluid supply system. Carbon dioxide is a supercritical fluid when maintained at or above a pressure of about 1070 psi at a temperature of 31 degrees C., a pressure that varies inversely with temperature. This state of the fluid in the processing chamber may be maintained by operating the chamber at 2,000 to 6,000 psi at a temperature of between 60 and 100 degrees C., for example. The fluid supply system 140 can be coupled to the recirculation system 120, but this is not required. In alternate embodiments, fluid supply system supply system 140 can be configured differently and coupled differently. For example, the fluid supply system 140 can be coupled directly to the processing chamber 110.

As described above, the fluid supply system 140 can include a supercritical fluid supply system, which can be a carbon dioxide supply system. For example, the fluid supply system 140 can be configured to introduce a high pressure fluid having a pressure substantially near the critical pressure for the fluid. Additionally, the fluid supply system 140 can be configured to introduce a supercritical fluid, such as carbon dioxide in a supercritical state. Examples of other supercritical fluid species useful in the broad practice of the invention include, but are not limited to, carbon dioxide (as described above), oxygen, argon, krypton, xenon, ammonia, methane, methanol, dimethyl ketone, hydrogen, and sulfur hexafluoride. The fluid supply system can, for example, comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The fluid supply system 140 can comprise an inlet valve (not shown) that is configured to open and close to allow or prevent the stream of supercritical carbon dioxide from flowing into the processing chamber 110. For example, controller 150 can be used to determine fluid parameters such as pressure, temperature, process time, and flow rate.

Referring still to FIG. 1, the process chemistry supply system 130 is coupled to the recirculation system 120, but this is not required for the invention. In alternate embodiments, the process chemistry supply system 130 can be configured differently, and can be coupled to different elements in the processing system 100. The process chemistry is introduced by the process chemistry supply system 130 into the fluid introduced by the fluid supply system 140 at ratios that vary with the substrate properties, the chemistry being used and the process being performed in the chamber. Usually the ratio is roughly 1 to 5 percent by volume, which, for a chamber, recirculation system and associated plumbing having a volume of about 1 liter amounts to about 10 to 50 milliliter of additive in most cases, but the ratio may be higher or lower.

The process chemistry supply system 130 can be configured to introduce one or more of the following process compositions, but not limited to: cleaning compositions for removing contaminants, residues, hardened residues, photoresist, hardened photoresist, post-etch residue, post-ash residue, post chemical-mechanical polishing (CMP) residue, post-polishing residue, or post-implant residue, or any combination thereof; cleaning compositions for removing particulate; drying compositions for drying thin films, porous thin films, porous low dielectric constant materials, or air-gap dielectrics, or any combination thereof; film-forming compositions for preparing dielectric thin films, metal thin films, or any combination thereof; or any combination thereof. Additionally, the process chemistry supply system 130 can be configured to introduce solvents, co-solvents, surfactants, film-forming precursors, or reducing agents, or any combination thereof.

The process chemistry supply system 130 can be configured to introduce N-Methyl Pyrrolidone (NMP), diglycol amine, hydroxylamine, di-isopropyl amine, tri-isoprpyl amine, tertiary amines, catechol, ammonium fluoride, ammonium bifluoride, methylacetoacetamide, ozone, propylene glycol monoethyl ether acetate, acetylacetone, dibasic esters, ethyl lactate, $CHF_3$, $BF_3$, HF, other fluorine containing chemicals, or any mixture thereof. Other chemicals such as organic solvents may be utilized independently or in conjunction with the above chemicals to remove organic materials. The organic solvents may include, for example, an alcohol, ether, and/or glycol, such as acetone, diacetone alcohol, dimethyl sulfoxide (DMSO), ethylene glycol, methanol, ethanol, propanol, or isopropanol (IPA). For further details, see U.S. Pat. No. 6,306,564B1, filed May 27, 1998, and titled "REMOVAL OF RESIST OR RESIDUE FROM SEMICONDUCTORS USING SUPERCRITICAL CARBON DIOXIDE", and U.S. Pat. No. 6,509,141B2, filed Sep. 3, 1999, and titled "REMOVAL OF PHOTORESIST AND PHOTORESIST RESIDUE FROM SEMICONDUCTORS USING SUPERCRITICAL CARBON DIOXIDE PROCESS," both incorporated by reference herein.

Additionally, the process chemistry supply system 130 can comprise a cleaning chemistry assembly (not shown) for providing cleaning chemistry for generating supercritical cleaning solutions within the processing chamber. The cleaning chemistry can include peroxides and a fluoride source. For example, the peroxides can include hydrogen peroxide, benzoyl peroxide, or any other suitable peroxide, and the fluoride sources can include fluoride salts (such as ammonium fluoride salts), hydrogen fluoride, fluoride adducts (such as organo-ammonium fluoride adducts), and combinations thereof. Further details of fluoride sources and methods of generating supercritical processing solutions with fluoride sources are described in U.S. patent application Ser. No. 10/442,557, filed May 20, 2003, and titled "TETRA-ORGANIC AMMONIUM FLUORIDE AND HF IN SUPERCRITICAL FLUID FOR PHOTORESIST AND RESIDUE REMOVAL", and U.S. patent application Ser. No. 10/321, 341, filed Dec. 16, 2002, and titled "FLUORIDE IN SUPERCRITICAL FLUID FOR PHOTORESIST POLYMER AND RESIDUE REMOVAL," both incorporated by reference herein.

Furthermore, the process chemistry supply system 130 can be configured to introduce chelating agents, complexing agents and other oxidants, organic and inorganic acids that can be introduced into the supercritical fluid solution with one or more carrier solvents, such as N,N-dimethylacetamide (DMAc), gamma-butyrolactone (BLO), dimethyl sulfoxide (DMSO), ethylene carbonate (EC), N-methylpyrrolidone (NMP), dimethylpiperidone, propylene carbonate, and alcohols (such a methanol, ethanol and 2-propanol).

Moreover, the process chemistry supply system 130 can comprise a rinsing chemistry assembly (not shown) for providing rinsing chemistry for generating supercritical rinsing solutions within the processing chamber. The rinsing chemistry can include one or more organic solvents including, but not limited to, alcohols and ketone. In one embodiment, the rinsing chemistry can comprise sulfolane, also known as thiocyclopenatne-1,1-dioxide, (Cyclo) tetramethylene sulphone and 2,3,4,5-tetrahydrothiophene-1,1-dioxide, which can be purchased from a number of venders, such as Degussa Stanlow Limited, Lake Court, Hursley Winchester SO21 2LD UK.

Moreover, the process chemistry supply system 130 can be configured to introduce treating chemistry for curing, cleaning, healing, or sealing, or any combination, low dielectric constant films (porous or non-porous). The chemistry can include hexamethyldisilazane (HMDS), chlorotrimethylsilane (TMCS), or trichloromethylsilane (TCMS). For further details, see U.S. patent application Ser. No. 10/682,196, filed Oct. 10, 2003, and titled "METHOD AND SYSTEM FOR TREATING A DIELECTRIC FILM," and U.S. patent application Ser. No. 10/379,984, filed Mar. 4, 2003, and titled "METHOD OF PASSIVATING LOW DIELECTRIC MATERIALS IN WAFER PROCESSING," both incorporated by reference herein.

The processing chamber 110 can be configured to process substrate 105 by exposing the substrate 105 to fluid from the fluid supply system 140, or process chemistry from the process chemistry supply system 130, or a combination thereof in a processing space 112. Additionally, processing chamber 110 can include an upper chamber assembly 114, and a lower chamber assembly 115.

The upper chamber assembly 112 can comprise a heater (not shown) for heating the processing chamber 110, the substrate 105, or the processing fluid, or a combination of two or more thereof. Alternately, a heater is not required. Additionally, the upper chamber assembly can include flow components for flowing a processing fluid through the processing chamber 110. In one example, a circular flow pattern can be established. Alternately, the flow components for flowing the fluid can be configured differently to affect a different flow pattern.

The lower chamber assembly 115 can include a platen 116 configured to support substrate 105 and a drive mechanism 118 for translating the platen 116 in order to load and unload substrate 105, and seal lower chamber assembly 115 with upper chamber assembly 114. The platen 116 can also be configured to heat or cool the substrate 105 before, during, and/or after processing the substrate 105. Additionally, the lower assembly 115 can include a lift pin assembly for displacing the substrate 105 from the upper surface of the platen 116 during substrate loading and unloading.

A transfer system (not shown) can be used to move a substrate into and out of the processing chamber 110 through a slot (not shown). In one example, the slot can be opened and closed by moving the platen, and in another example, the slot can be controlled using a gate valve.

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, and Ta. The dielectric material can include silica, silicon dioxide, quartz, aluminum oxide, sapphire, low dielectric constant materials, Teflon, and polyimide. The ceramic material can include aluminum oxide, silicon carbide, etc.

The processing system 100 can also comprise a pressure control system (not shown). The pressure control system can be coupled to the processing chamber 110, but this is not required. In alternate embodiments, pressure control system can be configured differently and coupled differently. The pressure control system can include one or more pressure valves (not shown) for exhausting the processing chamber 110 and/or for regulating the pressure within the processing chamber 110. Alternately, the pressure control system can also include one or more pumps (not shown). For example, one pump may be used to increase the pressure within the processing chamber, and another pump may be used to evacuate the processing chamber 110. In another embodiment, the pressure control system can comprise seals for sealing the processing chamber. In addition, the pressure control system can comprise an elevator for raising and lowering the substrate and/or the platen.

Furthermore, the processing system 100 can comprise an exhaust control system. The exhaust control system can be coupled to the processing chamber 110, but this is not required. In alternate embodiments, exhaust control system can be configured differently and coupled differently. The exhaust control system can include an exhaust gas collection vessel (not shown) and can be used to remove contaminants from the processing fluid. Alternately, the exhaust control system can be used to recycle the processing fluid.

Figure 2:
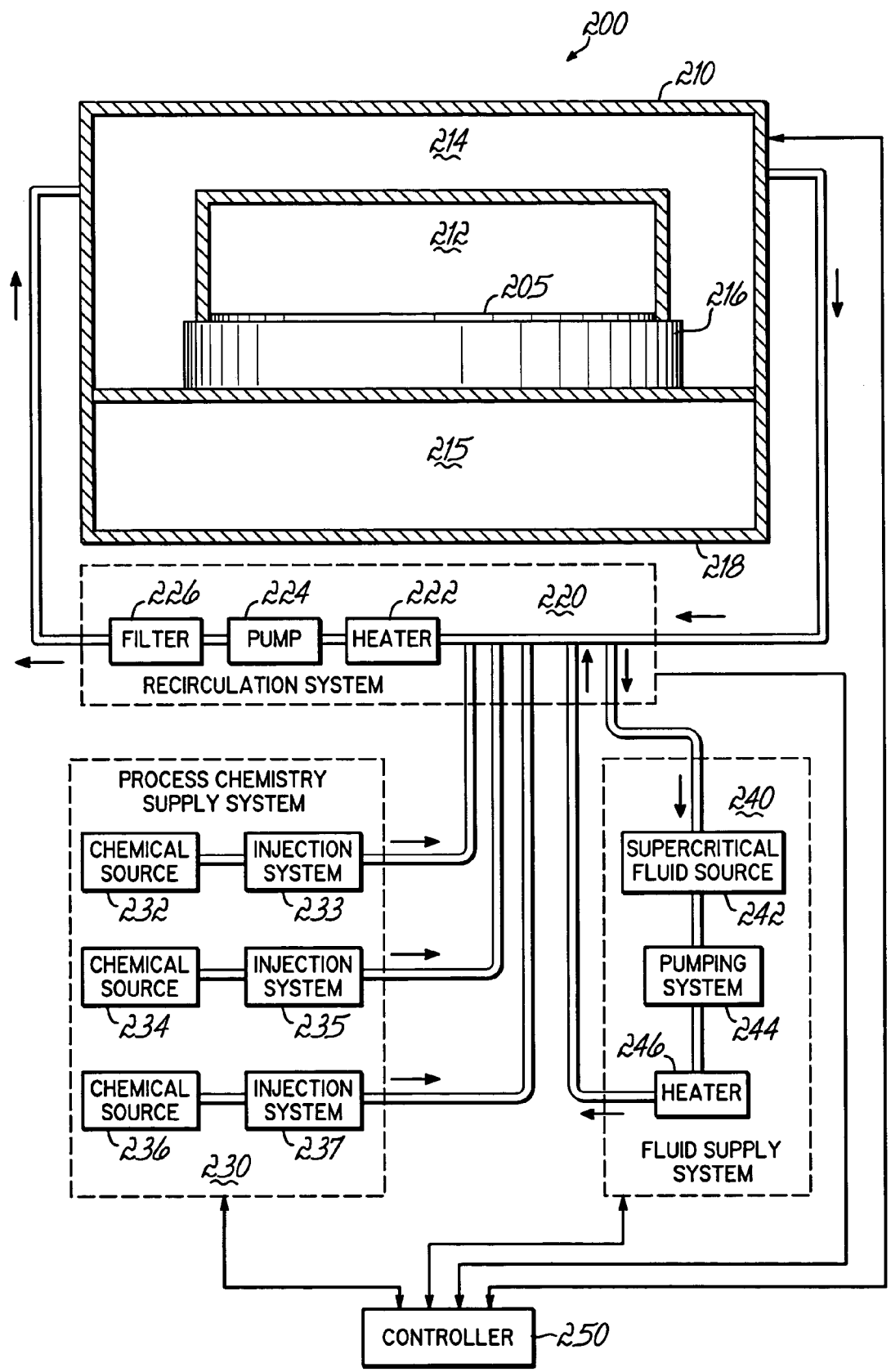
FIG. 2 presents another simplified schematic representation of a processing system.

Referring now to FIG. 2, a processing system 200 is presented according to another embodiment. In the illustrated embodiment, processing system 200 comprises a processing chamber 210, a recirculation system 220, a process chemistry supply system 230, a fluid supply system 240, and a controller 250, all of which are configured to process substrate 205. The controller 250 can be coupled to the processing chamber 210, the recirculation system 220, the process chemistry supply system 230, and the fluid supply system 240. Alternately, controller 250 can be coupled to a one or more additional controllers/computers (not shown), and controller 250 can obtain setup and/or configuration information from an additional controller/computer.

As shown in FIG. 2, the recirculation system 220 can include a recirculation fluid heater 222, a pump 224, and a filter 226. Additionally, the process chemistry supply system 230 can include one or more chemistry introduction systems, each introduction system having a chemical source 232, 234, 236, and an injection system 233, 235, 237. The injection systems 233, 235, 237 can include a pump and an injection valve. Furthermore, the fluid supply system 240 can include a supercritical fluid source 242, a pumping system 244, and a supercritical fluid heater 246. Moreover, one or more injection valves, or exhaust valves may be utilized with the fluid supply system.

Figure 3:
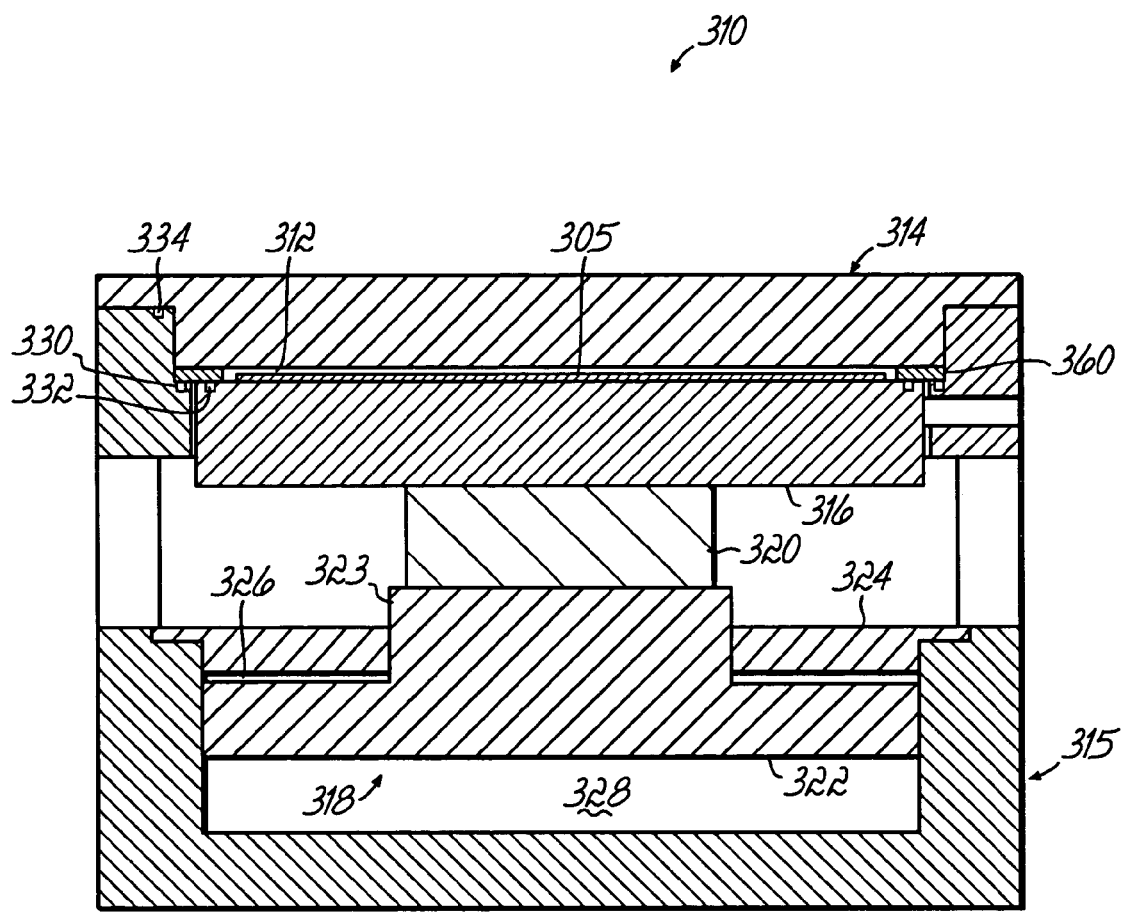
FIG. 3 presents another simplified schematic representation of a processing system.

Moreover, the processing system can include the system described in pending U.S. patent application Ser. No. 09/912,844 (U.S. Patent Application Publication No. 2002/0046707 A1), entitled "High pressure processing chamber for semiconductor substrates", and filed on Jul. 24, 2001, which is incorporated herein by reference in its entirety. For example, FIG. 3 depicts a cross-sectional view of a supercritical processing chamber 310 comprising upper chamber assembly 314, lower chamber assembly 315, platen 316 configured to support substrate 305, and drive mechanism 318 configured to raise and lower platen 316 between a substrate loading/unloading condition and a substrate processing condition. Drive mechanism 318 can further include a drive cylinder 320, drive piston 322 having piston neck 323, sealing plate 324, pneumatic cavity 326, and hydraulic cavity 328. Additionally, supercritical processing chamber 310 further includes a plurality of sealing devices 330, 332, and 334 for providing a sealed, high pressure space 312 in the processing chamber 310.

Figure 4A:
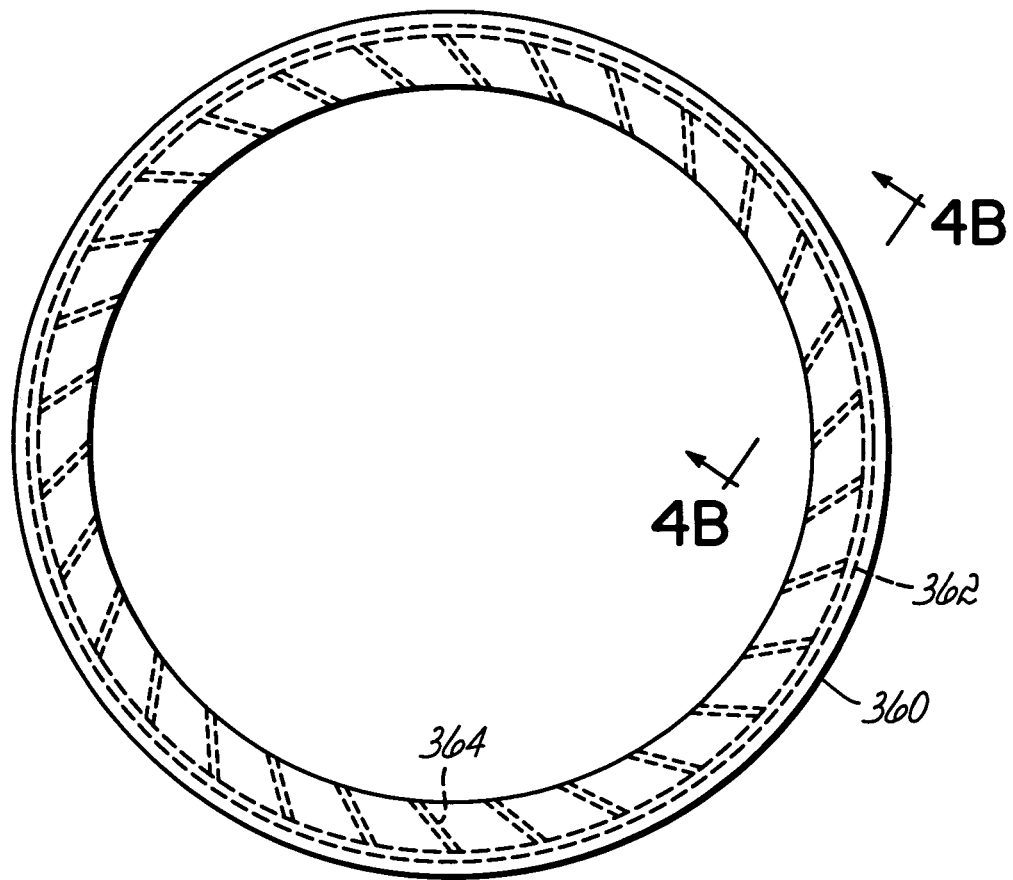
FIGS. 4A and 4B depict a fluid injection manifold for introducing fluid to a processing system.
Figure 4B:
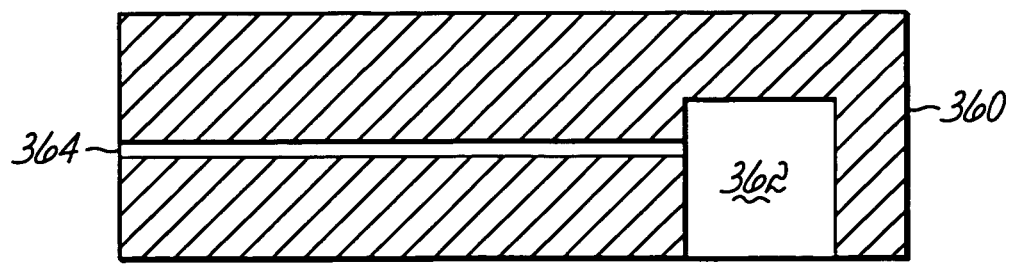

As described above with reference to FIGS. 1, 2, and 3, the recirculation system coupled to the processing chamber is configured to circulate the fluid through the processing chamber, and thereby permit the exposure of the substrate in the processing chamber to a flow of fluid. The fluid, such as supercritical carbon dioxide, with or without process chemistry can enter the processing chamber at a peripheral edge of the substrate through one or more inlets coupled to the recirculation system. For example, referring now to FIG. 3 and FIGS. 4A and 4B, an injection manifold 360 is shown as a ring having an annular fluid supply channel 362 coupled to one or more inlets 364. The one or more inlets 364, as illustrated, include forty five (45) injection orifices canted at 45 degrees, thereby imparting both azimuthal momentum, or axial momentum, or both, as well as radial momentum to the flow of high pressure fluid through process space 312 above substrate 305. Although shown to be canted at an angle of 45 degrees, the angle may be varied, including direct radial inward injection.

Additionally, the fluid, such as supercritical carbon dioxide, exits the processing chamber adjacent a surface of the substrate through one or more outlets. In doing so, a fluid vortex is formed in the process space 312, creating weak velocities at the peripheral edge of substrate 305, and intense velocities at the center of substrate 305. However, as described in U.S. patent application Ser. No. 09/912,844, the one or more outlets can include two outlet holes positioned proximate to and above the center of substrate 305. The flow through the two outlets can be alternated from one outlet to the next outlet using a shutter valve and, therefore, the center of the fluid vortex can be shifted in space between the locations of the two outlets. Although the center of the fluid vortex moves in time and is no longer stationary at the center of substrate 305, the inventors have observed the velocity field to be non-uniform and, consequently, a non-uniform treating rate is observed on substrate 305.

Figure 5A:
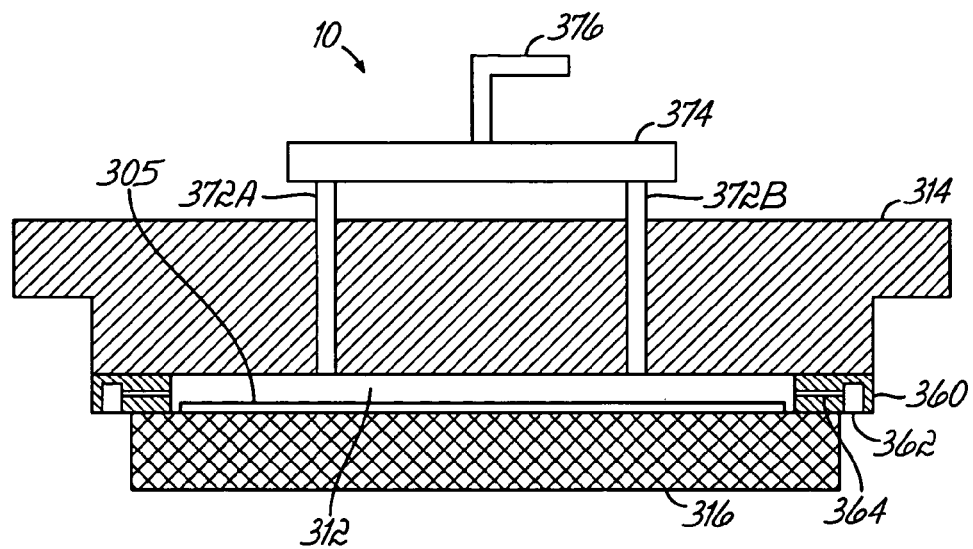
FIGS. 5A and 5B present a fluid exhaust manifold according to an embodiment of the invention.
Figure 5B:
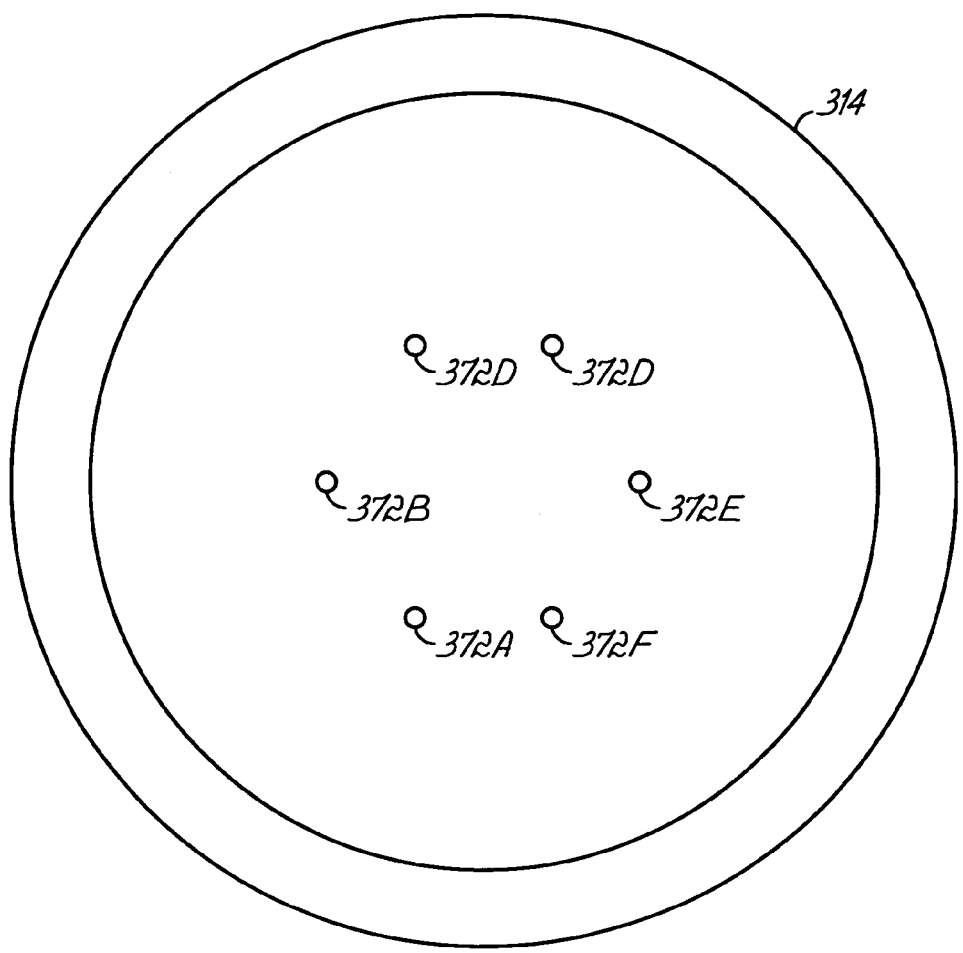

According to one embodiment, three or more outlets are located adjacent to substrate 305, and the flow of fluid through the three or more outlets is cyclically and sequentially alternated in order to provide a substantially uniform velocity field. A substantially uniform velocity field can include a velocity field having a variation of plus or minus 100% the average value and, desirably, a variation of plus or minus 50%. FIG. 5A illustrates a cross-sectional view of a portion of a processing system comprising upper assembly 314, platen 316, injection manifold 360, and exhaust manifold 370. As illustrated in FIGS. 5A and 5B, the exhaust manifold 370 includes six (6) outlets 372A-F (two of which are shown in cross-section in FIG. 5A, namely, 372A and 372B). Each inlet has a first end coupled to the process space 312, and a second end coupled to a valve assembly 374. According to the operation of the valve system 374, the flow of fluid is permitted through one of the six outlets and into circulation line 376, and then alternated through the remaining outlets.

Figure 6A:
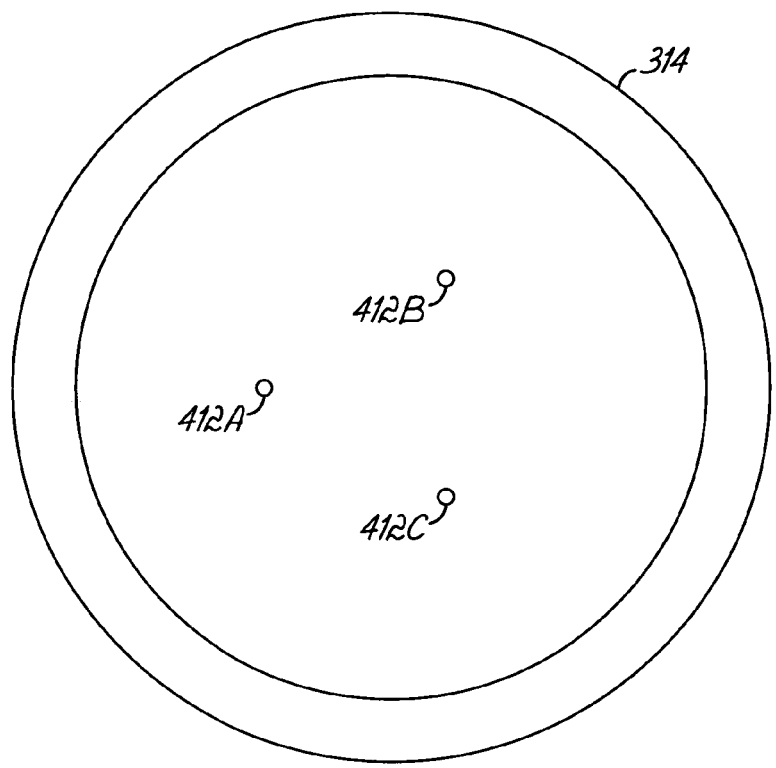
FIG. 6A presents a fluid exhaust manifold according to another embodiment of the invention.
Figure 6B:
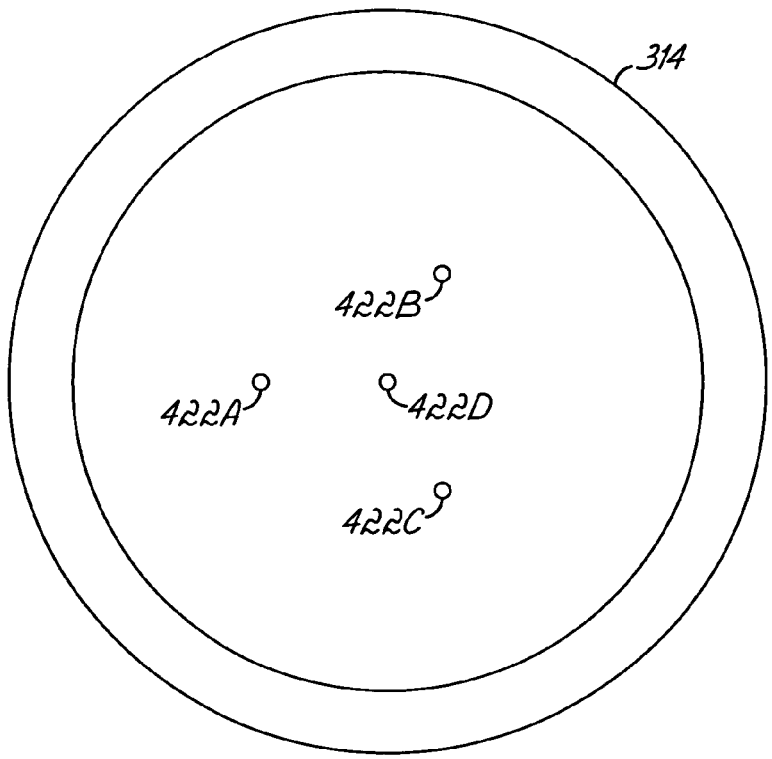
FIG. 6B presents a fluid exhaust manifold according to another embodiment of the invention.
Figure 6C:
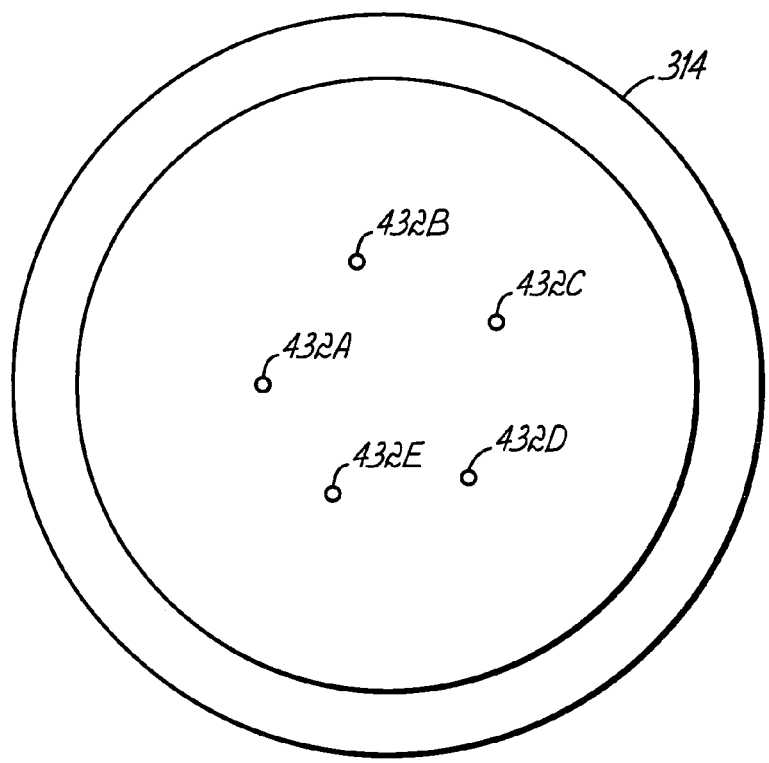
FIG. 6C presents a fluid exhaust manifold according to another embodiment of the invention.
Figure 6D:
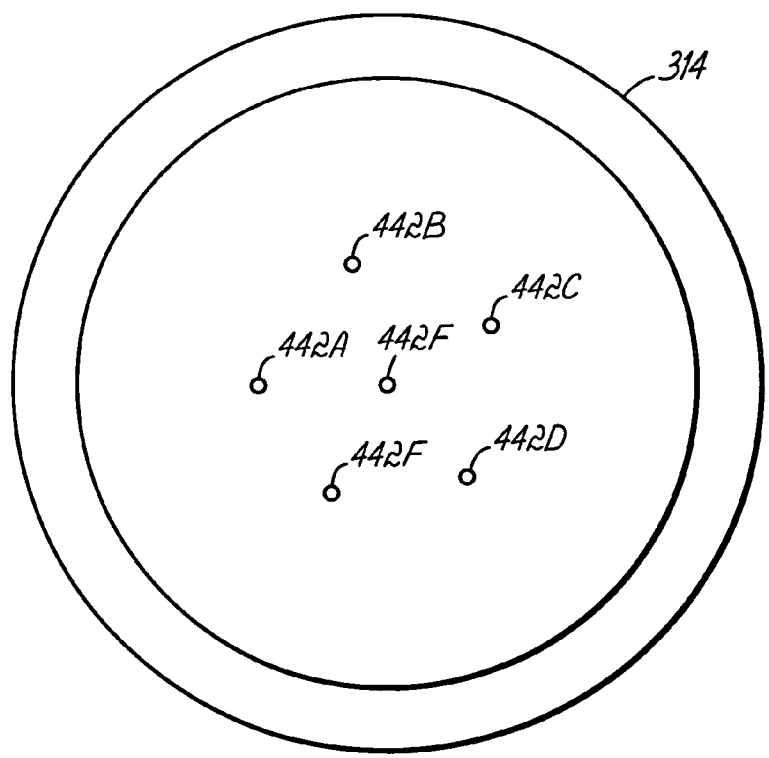
FIG. 6D presents a fluid exhaust manifold according to another embodiment of the invention.
Figure 6E:
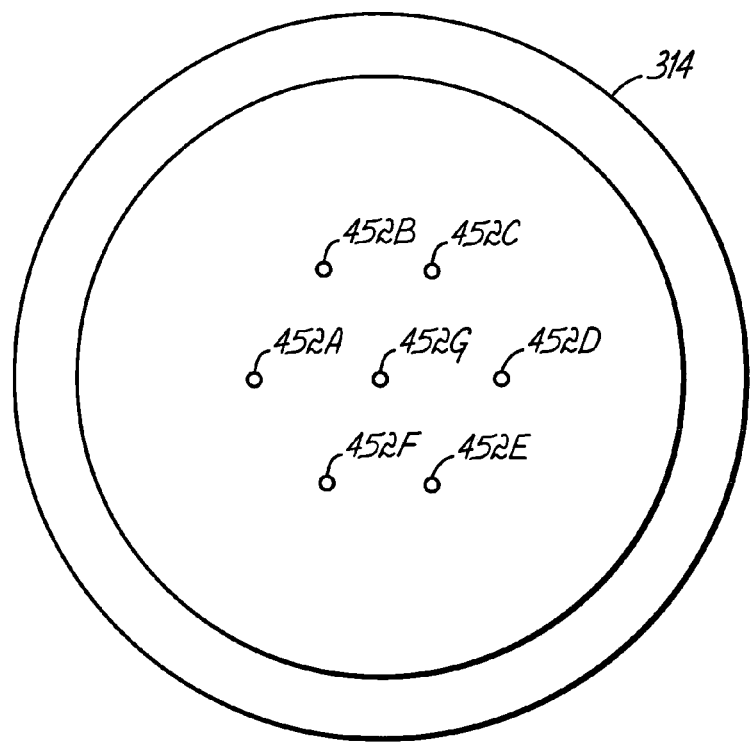
FIG. 6E presents a fluid exhaust manifold according to another embodiment of the invention.

Although six outlets are shown in FIGS. 5A and 5B, the number of outlets can vary, and can include, for example, three outlets (412A-C) as shown in FIG. 6A, four outlets (422A-D) as shown in FIG. 6B, five outlets (432A-E) as shown in FIG. 6C, six outlets (442A-F) as shown in FIG. 6D, seven outlets (452A-G) as shown in FIG. 6E, or more.

The location of each outlet and the time during which fluid is removed at each outlet is determined in order to minimize variations in the ensemble averaged velocity field over the substrate. For example, as depicted in FIGS. 5B, 6A, 6B, 6C, 6D, and 6E, the three or more outlets can be located at substantially the same radius above the substrate, with or without an additional outlet at substantially the center of the substrate. Alternatively, the three or more outlets can be located at different radii. The radial location can range from 5% to 100% of the substrate radius and, more desirably, the radial location ranges from 50% to 80% of the substrate radius. Although the three or more outlets are shown to be at substantially the same radial location, it is not necessary to do so in order to achieve a uniform, ensemble-averaged velocity field and, therefore, the scope of the invention should not be limited in any way.

Figure 7A:
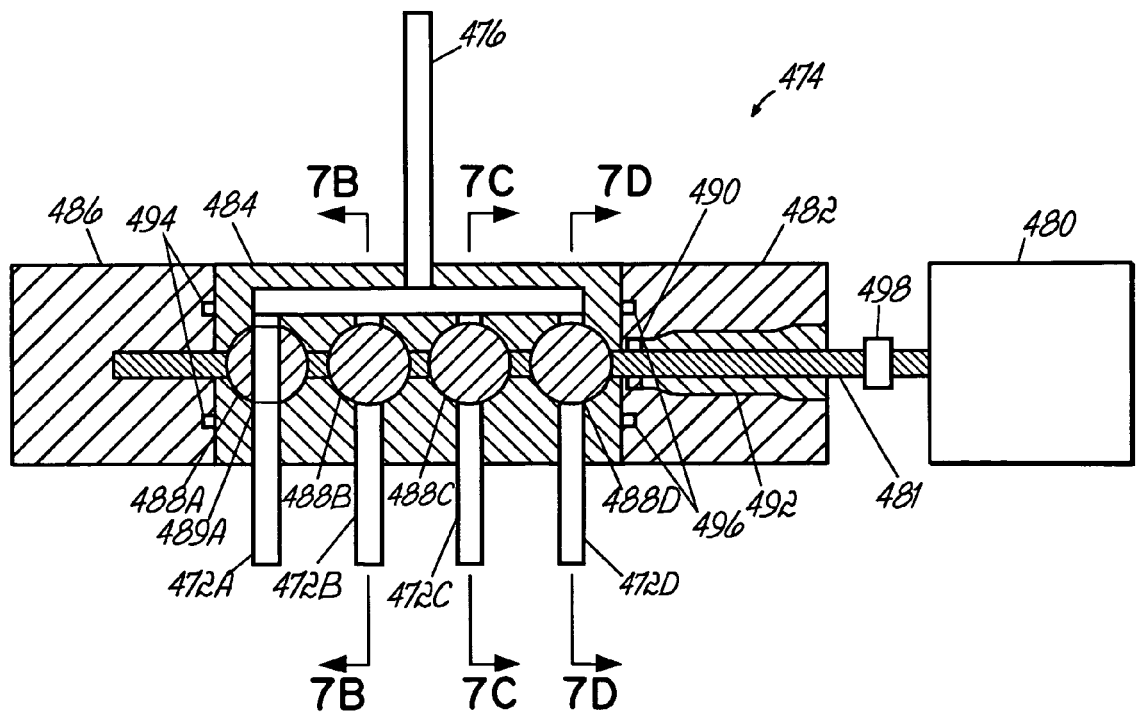
FIGS. 7A, 7B, 7C, and 7D depict an exemplary valve assembly.

Referring now to FIG. 7A, a valve assembly 474 is illustrated in cross-section according to one embodiment. The valve assembly 474 is configured to permit the flow of high pressure fluid from one of, for instance, four (4) outlets 472A, 472B, 472C, and 472D from the processing system into a single circulation line 476. The valve assembly 474 comprises a valve body 484 coupled to a first bearing block 486 on one end, and coupled to a second bearing block 482 on an opposite end.

Figure 7B:
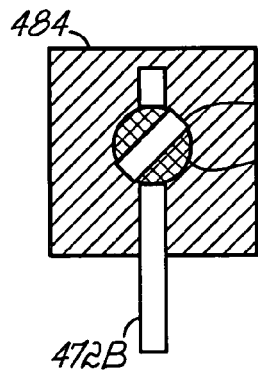
Figure 7C:
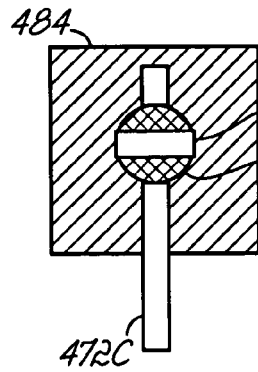
Figure 7D:
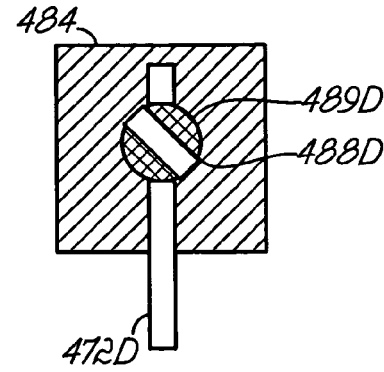

The valve body 484 houses a multi-ball valve having, for instance, four ball valves 488A, 488B, 488C, and 488D coupled to a shaft 481 driven by rotary drive mechanism 480. As the shaft 481 is rotated, one of the four outlets 472A, 472B, 472C, and 472D from the processing system is aligned with one of the ball valves 488A, 488B, 488C, and 488D, hence, permitting the flow of high pressure fluid therethrough. For example, FIG. 7A illustrates ball passage 489A open for outlet 472A. As the shaft 481 is rotated in sequences of forty five degrees, each of the remaining ball passages 489B, 489C, and 489D are opened. FIGS. 7B, 7C, and 7D illustrate the positions of the remaining ball passages when the first passage 489A is open. The rotary drive mechanism 480 can include a pneumatically driven system, or an electric stepper motor. Additionally, the drive system can utilized a coupler 498 for absorbing axial loads.

Sealing devices 494 and 496, such as elastomer O-ring seals, are utilized to seal the first bearing block 482 with the valve body 484, and the second bearing block 482 with the valve body 484, respectively. Furthermore, the second bearing block 482 includes a rotary seal 490, such as a high pressure rotary seal, and a seal retaining device 492 fastened to the second bearing block 482. The rotary seal 490 can include a spring energized PTFE rotary lip seal as commercially available from Bal Seal Engineering Co., Inc. (Foothill Ranch, Calif.).

Alternatively, the drive system can utilize a magnetic coupler, thus permitting the design of a closed valve body and relieving the need for a rotary seal.

Figure 8A:
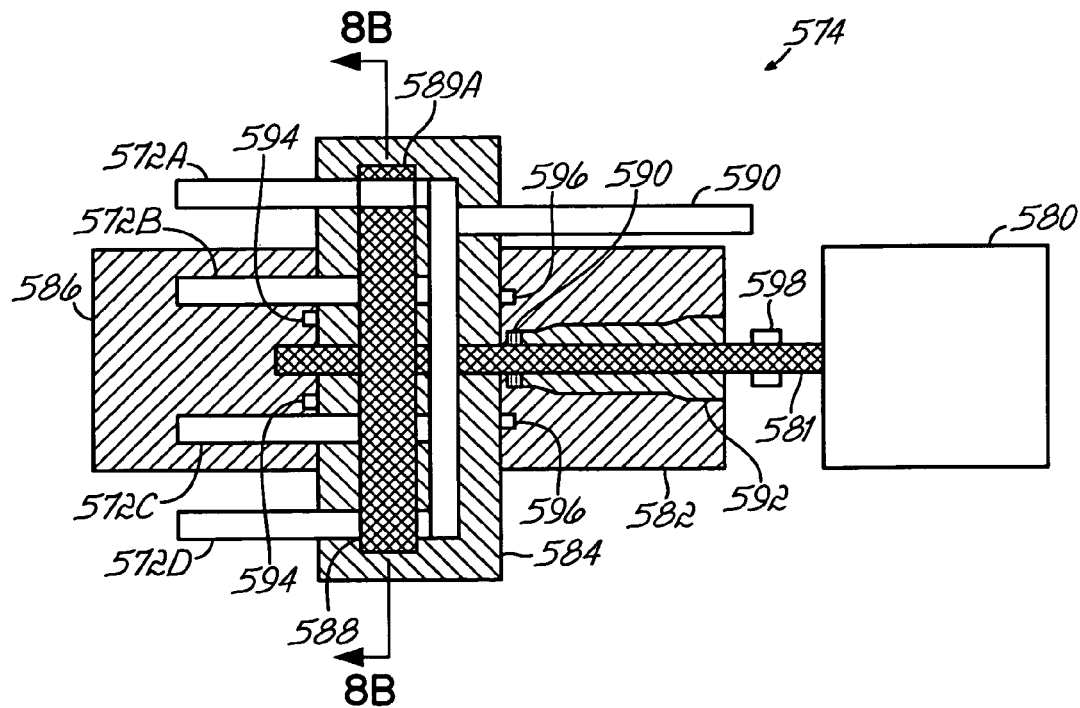
FIGS. 8A and 8B depict another exemplary valve assembly.
Figure 8B:
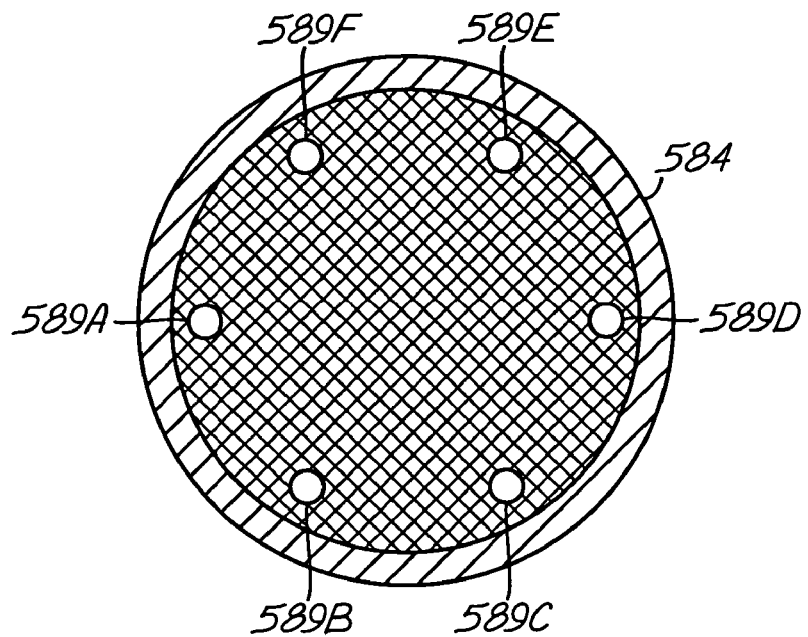

Referring now to FIGS. 8A and 8B, a valve assembly 574 is illustrated in cross-section according to another embodiment. The valve assembly 574 is configured to permit the flow of fluid from one of, for instance, six (6) outlets 572A, 572B, 572C, 572D, 572E, and 572F from the processing system into a single circulation line 576. The valve assembly 574 comprises a valve body 584 coupled to a first bearing block 586 on one end, and coupled to a second bearing block 582 on an opposite end.

The valve body 584 houses a multi-passage disc 588 having, for instance, six passages 589A, 589B, 589C, 589D, 589E, and 589F coupled to a shaft 581 driven by rotary drive mechanism 580. As the shaft 581 is rotated, one of the six outlets 572A, 572B, 572C, and 572D (remaining two not shown) from the processing system is aligned with one of the passages 589A, 589B, 589C, and 589D (and 589E and 589F, respectively), hence, permitting the flow of fluid therethrough. For example, FIG. 8A illustrates passage 589A open for outlet 572A. As the shaft 581 is rotated in sequences of sixty degrees, each of the remaining passages 589B, 589C, 589D, 589E, and 589F are opened. FIG. 8B illustrates the positions of the remaining five passages when the first passage 589A is open. The rotary drive mechanism 580 can include a pneumatically driven system, or an electric stepper motor. Additionally, the drive system can utilized a coupler 598 for absorbing axial loads.

Sealing devices 594 and 596, such as elastomer O-ring seals, are utilized to seal the first bearing block 582 with the valve body 584, and the second bearing block 582 with the valve body 584, respectively. Furthermore, the second bearing block 582 includes a rotary seal 590, such as a high pressure rotary seal, and a seal retaining device 592 fastened to the second bearing block 582. The rotary seal 590 can include a spring energized PTFE rotary lip seal as commercially available from Bal Seal Engineering Co., Inc. (Foothill Ranch, Calif.).

Alternatively, the drive system can utilize a magnetic coupler, thus permitting the design of a closed valve body and relieving the need for a rotary seal.

Figure 9:
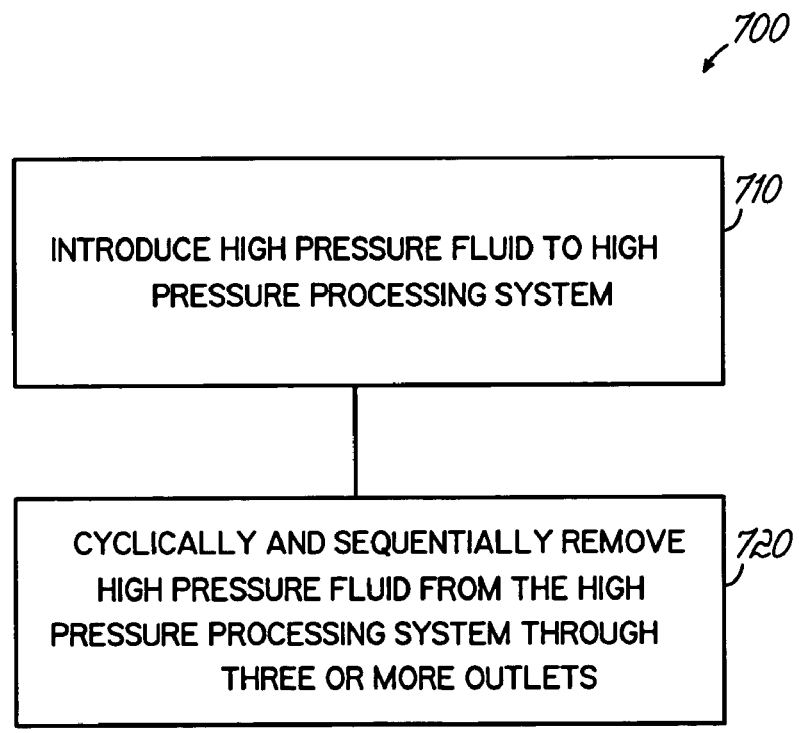
FIG. 9 illustrates a method of operating a processing system according to an embodiment of the invention.

Now referring to FIG. 9, a method of operating a processing system is described. The method includes flow chart 700 beginning in 710 with introducing fluid to a processing system through one or more inlets. In 720, fluid is cyclically and sequentially removed from the processing system from three or more outlets. The fluid is cyclically and sequentially removed in order to provide for a substantially uniform velocity field over the substrate being processed in the processing system. For example, the location of each outlet and the time during which fluid is removed at each outlet is determined in order to minimize variations in the ensemble averaged velocity field over the substrate. Alternatively, for example, the location of each outlet and the time during which fluid is removed at each outlet is determined in order to minimize number of particles added to the substrate during treatment.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A processing system for treating a substrate comprising:
a processing chamber configured to treat said substrate with a fluid, introduced therein, having substantially supercritical fluid properties;
a supercritical fluid source;
a fluid supply system coupled to said processing chamber, and configured to introduce a fluid from said supercritical fluid source to said processing chamber;

a fluid flow system coupled to said processing chamber, and configured to flow said fluid through said processing chamber over said substrate;

one or more inlets coupled to said fluid flow system, and configured to introduce said fluid to said processing chamber;

an outlet manifold coupled to said fluid flow system and having:
- three or more outlets coupled to said fluid flow system and positioned adjacent a surface of said substrate, wherein said three or more outlets are configured to remove said fluid from said processing chamber, and
- a valve manifold coupled to said three or more outlets and configured to cyclically and sequentially alter the flow of said fluid through said three or more outlets; and said one or more inlets being coupled to said processing chamber at a peripheral edge of said substrate.

2. The processing system of claim 1, wherein said one or more inlets are configured to introduce said fluid radially inward over said substrate.

3. The processing system of claim 2, wherein said one or more inlets are further configured to introduce said fluid with an azimuthal velocity component.

4. A processing system for treating a substrate comprising:
a processing chamber configured to treat said substrate with a fluid, introduced therein, having substantially supercritical fluid properties;
a supercritical fluid source;
a fluid supply system coupled to said processing chamber, and configured to introduce a fluid from said supercritical fluid source to said processing chamber;
a fluid flow system coupled to said processing chamber, and configured to flow said fluid through said processing chamber over said substrate;
one or more inlets coupled to said fluid flow system, and configured to introduce said fluid to said processing chamber;
an outlet manifold coupled to said fluid flow system and having:
- three or more outlets coupled to said fluid flow system and positioned adjacent a surface of said substrate, wherein said three or more outlets are configured to remove said fluid from said processing chamber, and
- a valve manifold coupled to said three or more outlets and configured to cyclically and sequentially alter the flow of said fluid through said three or more outlets; and said three or more outlets being located at substantially the same radial location adjacent said substrate.

5. The processing system of claim 4, wherein said three or more outlets include an outlet at substantially the center of said substrate.

6. A processing system for treating a substrate comprising:
a processing chamber configured to treat said substrate with a fluid, introduced therein, having substantially supercritical fluid properties;
a supercritical fluid source;
a fluid supply system coupled to said processing chamber, and configured to introduce a fluid from said supercritical fluid source to said processing chamber;
a fluid flow system coupled to said processing chamber, and configured to flow said fluid through said processing chamber over said substrate;
one or more inlets coupled to said fluid flow system, and configured to introduce said fluid to said processing chamber;
an outlet manifold coupled to said fluid flow system and having:
- three or more outlets coupled to said fluid flow system and positioned adjacent a surface of said substrate, wherein said three or more outlets are configured to remove said fluid from said processing chamber, and
- a valve manifold coupled to said three or more outlets and configured to cyclically and sequentially alter the flow of said fluid through said three or more outlets; and said valve manifold comprising a shaft having at least one passage that is configured to rotate to three or more angular positions, whereby each of said three or more angular positions permits the flow of fluid from a unique outlet of said three or more outlets through said at least one passage to a single circulation line in said fluid flow system.

7. The processing system of claim 6, wherein said shaft includes three or more ball valves, each of said three or more ball valves having a passage configured to uniquely couple one of said three or more outlets to said single circulation line at one of said three or more angular positions.

8. A processing system for treating a substrate comprising:
a processing chamber configured to treat said substrate with a fluid, introduced therein, having substantially supercritical fluid properties;
a supercritical fluid source;
a fluid supply system coupled to said processing chamber and the supercritical fluid source, and configured to introduce a fluid from said supercritical fluid source to said processing chamber;
a fluid flow system coupled to said processing chamber, and configured to flow said fluid through said processing chamber over said substrate;
one or more inlets coupled to said fluid flow system, and configured to introduce said fluid to said processing chamber;
an outlet manifold coupled to said fluid flow system and having:
- three or more outlets coupled to said fluid flow system and positioned adjacent a surface of said substrate, wherein said three or more outlets are configured to remove said fluid from said processing chamber, and
- a valve manifold coupled to said three or more outlets and configured to cyclically and sequentially alter the flow of said fluid through said three or more outlets; and said three or more outlets being located at a radial location ranging from 5% to 100% of the radius of said substrate.

9. The processing system of claim 8, wherein said three or more outlets are located at a radial location ranging from 50% to 80% of the radius of said substrate.

* * * * *

UNITED STATES PATENT AND TRADEMARK OFFICE
CERTIFICATE OF CORRECTION

PATENT NO. : 7,582,181 B2 Page 1 of 1
APPLICATION NO. : 10/955326
DATED : September 1, 2009
INVENTOR(S) : Darko Babic It is certified that error appears in the above-identified patent and that said Letters Patent is hereby corrected as shown below:

Title Page, Item (57) Abstract, at line 5, "surface of a substrate to be process." should read --surface of a substrate to be processed.--.

In Column 4, lines 36-37, "fluid supply system supply system 140" should read --fluid supply system 140--.

In Column 5, lines 22-23, "or any combination thereof; or any combination thereof." should read --or any combination thereof.--.

In Column 9, line 48, "the drive system can utilized a coupler" should read --the drive system can utilize a coupler--.

In Column 10, line 20, "the drive system can utilized a coupler" should read --the drive system can utilize a coupler--.

Signed and Sealed this

Eighth Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,582,181 B2  Page 1 of 1
APPLICATION NO. : 10/955326
DATED : September 1, 2009
INVENTOR(S) : Darko Babic It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1352 days.

Signed and Sealed this

Fourteenth Day of September, 2010

David J. Kappos
*Director of the United States Patent and Trademark Office*